(12) United States Patent
Eigner et al.

(10) Patent No.: US 7,714,447 B2
(45) Date of Patent: May 11, 2010

(54) SEMICONDUCTOR CHIP ARRANGEMENT

(75) Inventors: Markus Eigner, Munich (DE);
Wolfgang Gruber, Olching-Neuesting (DE); Manfred Roth, Munich (DE);
Stefan Ruping, Lengdorf (DE)

(73) Assignee: Infineon Technologies AG, Neubiberg (DE)

( * ) Notice: Subject to any disclaimer, the term of this patent is extended or adjusted under 35 U.S.C. 154(b) by 233 days.

(21) Appl. No.: 11/213,341

(22) Filed: Aug. 25, 2005

(65) Prior Publication Data

US 2006/0038263 A1   Feb. 23, 2006

Related U.S. Application Data

(63) Continuation of application No. PCT/DE2004/000269, filed on Feb. 13, 2004.

(30) Foreign Application Priority Data

Feb. 26, 2003   (DE) ................................ 103 08 323

(51) Int. Cl.
*H01L 27/112* (2006.01)
(52) U.S. Cl. .............. 257/777; 257/529; 257/778; 257/E25.013; 257/E27.102; 438/109; 365/189.15
(58) Field of Classification Search ................ 257/777, 257/778, E25.013; 438/109; 361/760
See application file for complete search history.

(56) References Cited

U.S. PATENT DOCUMENTS

| 4,208,726 A | * | 6/1980 | McElroy .................... 365/104 |
| 4,939,568 A | | 7/1990 | Kato et al. |
| 5,070,026 A | * | 12/1991 | Greenwald et al. ............ 438/3 |
| 5,319,240 A | | 6/1994 | Faure et al. |
| 5,567,657 A | | 10/1996 | Wojnarowski et al. |
| 5,592,414 A | * | 1/1997 | Soneda et al. .......... 365/189.15 |
| 5,840,608 A | | 11/1998 | Chang |
| 5,847,442 A | | 12/1998 | Mills, Jr. et al. |
| 5,943,255 A | * | 8/1999 | Kutter et al. ................. 365/94 |
| 5,959,877 A | | 9/1999 | Takahsasi |
| 6,015,738 A | | 1/2000 | Levy |
| 6,541,869 B1 | | 4/2003 | Gudesen |
| 6,864,123 B2 | * | 3/2005 | Shimoda ..................... 438/130 |

FOREIGN PATENT DOCUMENTS

| EP | 0 073 486 A2 | 3/1983 |
| WO | WO-99/21235 A1 | 4/1999 |

* cited by examiner

*Primary Examiner*—Matthew E Warren
*Assistant Examiner*—John Lin
(74) *Attorney, Agent, or Firm*—Dickstein, Shapiro, LLP.

(57) ABSTRACT

A patterned connection plane between two semiconductor chips which are connected using face-to-face technology is patterned into first pads, second pads, and conductor strips which are alternatively connected to one of these pads. The conductor strips are connected to a read-out circuit in one of the semiconductor chips via connections.

2 Claims, 2 Drawing Sheets

SEMICONDUCTOR CHIP ARRANGEMENT

CROSS-REFERENCE TO RELATED APPLICATION

This application is a continuation of International Patent Application Serial No. PCT/DE2004/000269, filed Feb. 13, 2004, which published in German on Sep. 10, 2004 as WO 2004/077450, and is incorporated herein by reference in its entirety.

FIELD OF THE INVENTION

The present invention relates to a semiconductor chip arrangement.

BACKGROUND OF THE INVENTION

Increasing the storage density of ROM semiconductor chips is associated with considerable technical complexity. Since the dimensions of the memory cells can be reduced only with considerable effort, increasing the size of a ROM inevitably leads to an increased space requirement on the relevant semiconductor chip.

When fabricating semiconductor chip stacks using face-to-face technology, two semiconductor modules are directly connected to one another to form an overall system by electrically conductively connecting connection contact areas which are arranged on the top sides (which face one another) of the semiconductor modules to one another. In addition, the semiconductor chips are permanently connected to one another in a mechanically stable manner. To this end, a connection plane comprising a metallic solder is preferably arranged between the semiconductor chips, the connection plane ensuring that the two components are connected in a mechanically stable manner and, at the same time, ensuring that the connections are electrically connected. In this case, by far the largest area proportion of this connection plane is used only to mechanically connect the two components and is not used electrically.

SUMMARY OF THE INVENTION

It is an object of the present invention to specify a ROM semiconductor memory, which makes it possible to increase the size of the memory without increasing the size of the semiconductor chip.

A semiconductor chip arrangement with ROM, having first and second semiconductor chips arranged on top of one another and electrically conductively connected to one another such that they are permanently fastened to one another and to common connection contact areas in a patterned connection plane. The connection plane has an arrangement of contact areas provided in a form of a memory cell array, and a respective memory cell is programmed by means of a respective one of two intended forms of the contact areas. Electrical connections of the contact areas to a read-out circuit present in at least one of the semiconductor chips are provided for applying an electrical potential and reading a respective memory cell.

BRIEF DESCRIPTION OF THE DRAWINGS

There follows a more precise description of examples of the semiconductor chip arrangement with reference to FIGS. 1 to 4.

DETAILED DESCRIPTION OF PREFERRED EMBODIMENTS OF THE INVENTION

The semiconductor chip arrangement uses the connection plane between the semiconductor chips as ROM. For this purpose, the connection plane, which is formed from electrically conductive material, is patterned in such a manner that it has an arrangement of conductor areas, which arrangement is provided in the form of a memory cell array and can be read using the circuits present in the semiconductor chips. In this case, the conductor area assigned to a respective memory cell respectively has one of two intended forms, with the result that each memory cell has one of two programmed states. In this case, the read-out circuit may be arranged in one of the two semiconductor chips which are connected to one another or may be proportionately arranged in both semiconductor chips. Since the connection plane is passive and does not contain any active components, it is necessary to connect the relevant conductor areas to an electrical potential so that the respective programming of the memory cells can be detected by means of an electrical measurement. In the simplest case, the different forms of the conductor areas may be the presence or absence of a memory contact area that defines the memory cell. One preferred embodiment provides for the conductor area that is assigned to a respective memory cell to be connected to a portion of the connection plane that is connected to one of the potentials of the supply voltage.

Figure 1:
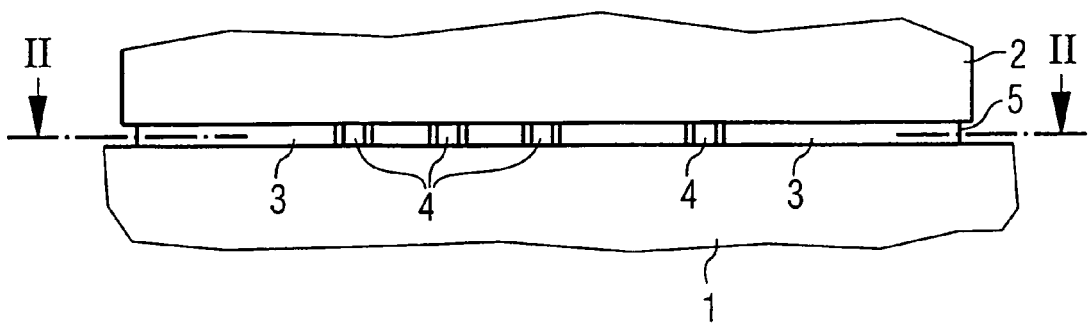
FIG. 1 shows a chip stack in cross section.

FIG. 1 illustrates, in cross section, a semiconductor chip arrangement, in which a first semiconductor chip 1 and a second semiconductor chip 2 are fastened one above the other. A connecting area 3 and connection contact areas 4 form a connection plane 5, in which the two semiconductor chips 1, 2 are connected to one another. The connecting area 3 may be made from the same material as the connection contact areas 4; it is used only to mechanically connect the two semiconductor chips to one another. The connection contact areas 4 are provided for electrically connecting the circuits present in the two semiconductor chips. The active components provided in the semiconductor chips are each preferably arranged on the top side that faces the other semiconductor chip and are directly provided with the connection contact areas 4 there.

Figure 2:
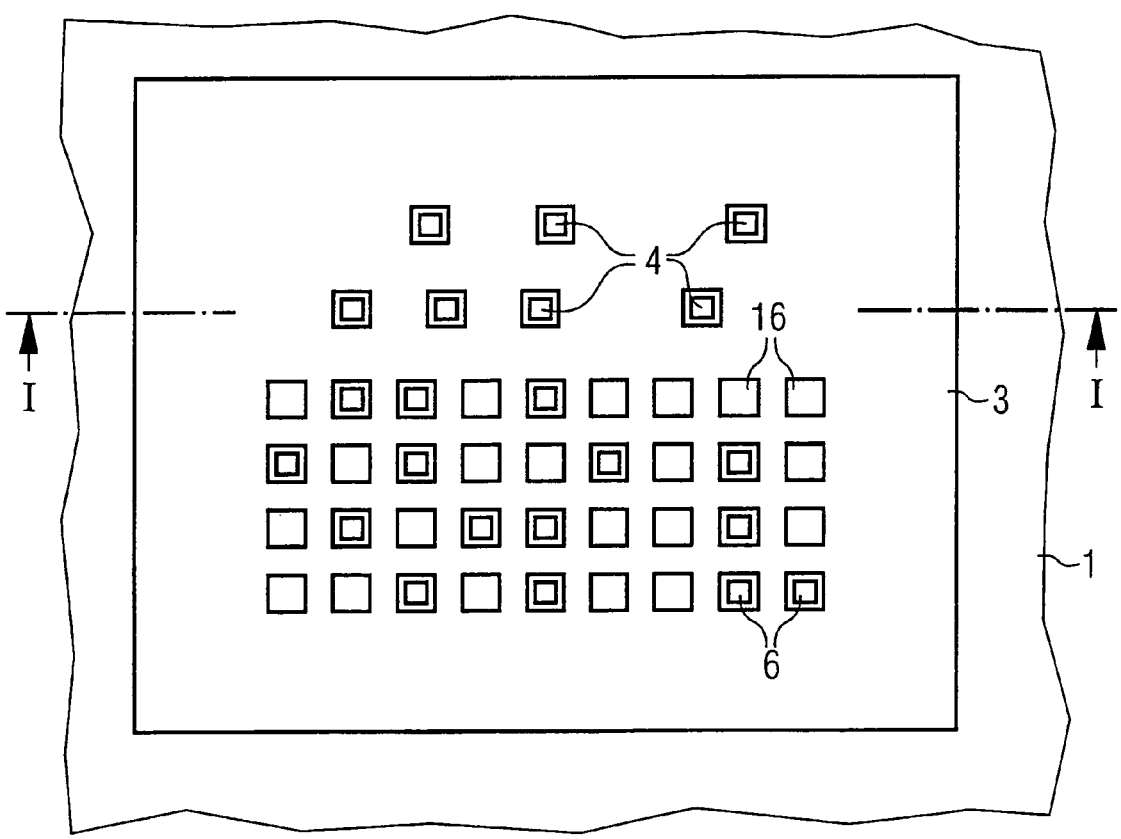
FIG. 2 shows a plan view of the lower semiconductor chip.

FIG. 2 shows the plan view—marked in FIG. 1—of the first semiconductor chip 1, in which the connecting area 3 and the connection contact areas 4 can be discerned. Cutouts 16 which are provided in the form of a memory cell array and form a matrix-like arrangement in this example are present in the connecting area 3. Memory contact areas 6 are arranged in a portion of the cutouts 16, the portion corresponding to the relevant programming. Programming the respective memory cell involves either the presence or the absence of the relevant memory contact area 6. If a respective memory contact area 6 is absent, no electrical connection that can be detected for the read-out circuit is situated at the relevant location. An electrical potential is applied to this memory cell array by the second semiconductor chip 2, for example. All of the memory contact areas 6 present are then at this potential. The drive circuit for addressing and reading out may be situated in the first semiconductor chip 1, in the second semiconductor chip 2 or in both chips in a manner such that it is divided up.

Figure 3:
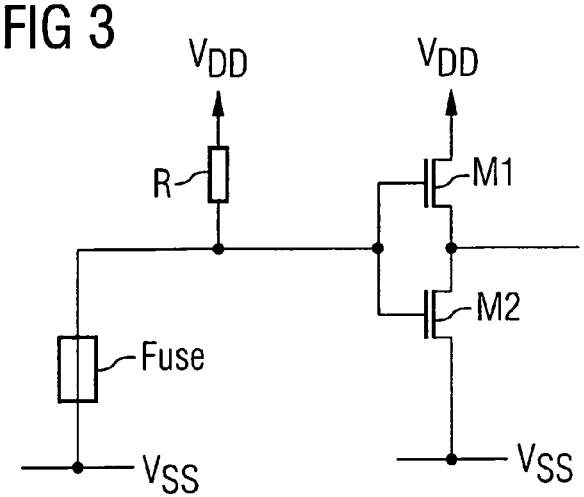
FIG. 3 shows a circuit for reading a memory cell.

FIG. 3 illustrates a circuit that is suited to reading a relevant memory cell. The presence of a memory contact area 6 corresponds to the presence of a conductive fuse, whereas the absence of a memory contact area 6 corresponds to an absent fuse or a fuse that has blown. This fuse is depicted in FIG. 3 with the designation "fuse". Together with a nonreactive resistor R, this fuse forms a voltage divider between the connections $V_{DD}$ and $V_{SS}$ of the supply voltage. The connection between the fuse and the resistor drives the gate connections of two field effect transistors M1 and M2. The source and drain connections of these field effect transistors M1, M2 are connected in series between the connections of the supply potential $V_{DD}$, $V_{SS}$. Depending on whether or not the fuse is conducting, the gate connection is at the potential $V_{SS}$ or at the potential $V_{DD}$. Depending on whether use is made of field effect transistors which are normally on or normally off, one or other potential of the supply voltage is applied to the output of the circuit. This circuit may be provided for each memory cell in the first semiconductor chip 1, for example.

The memory cell array provided in the connection plane 5 is programmed using a suitable mask when patterning the connection plane 5, with the result that memory contact areas 6 are produced or are not produced at the intended locations. If the potential $V_{SS}$ of the supply voltage is applied to the memory contact areas 6 present, for example by the second semiconductor chip 2, a voltage corresponding to the programming of the relevant memory cell can be tapped off at any location using the circuit illustrated in FIG. 3. The individual memory cells are addressed by means of an addressing circuit, which is known per se and is preferably provided in the other semiconductor chip, that is to say in the first semiconductor chip 1 in this example. In this embodiment of the semiconductor chip arrangement, a supply voltage is applied to all of the memory contact areas 6 in order to read the memory cell array. The power consumption in this exemplary embodiment is therefore relatively high. A further exemplary embodiment that is described below is improved in contrast therewith.

Figure 4:
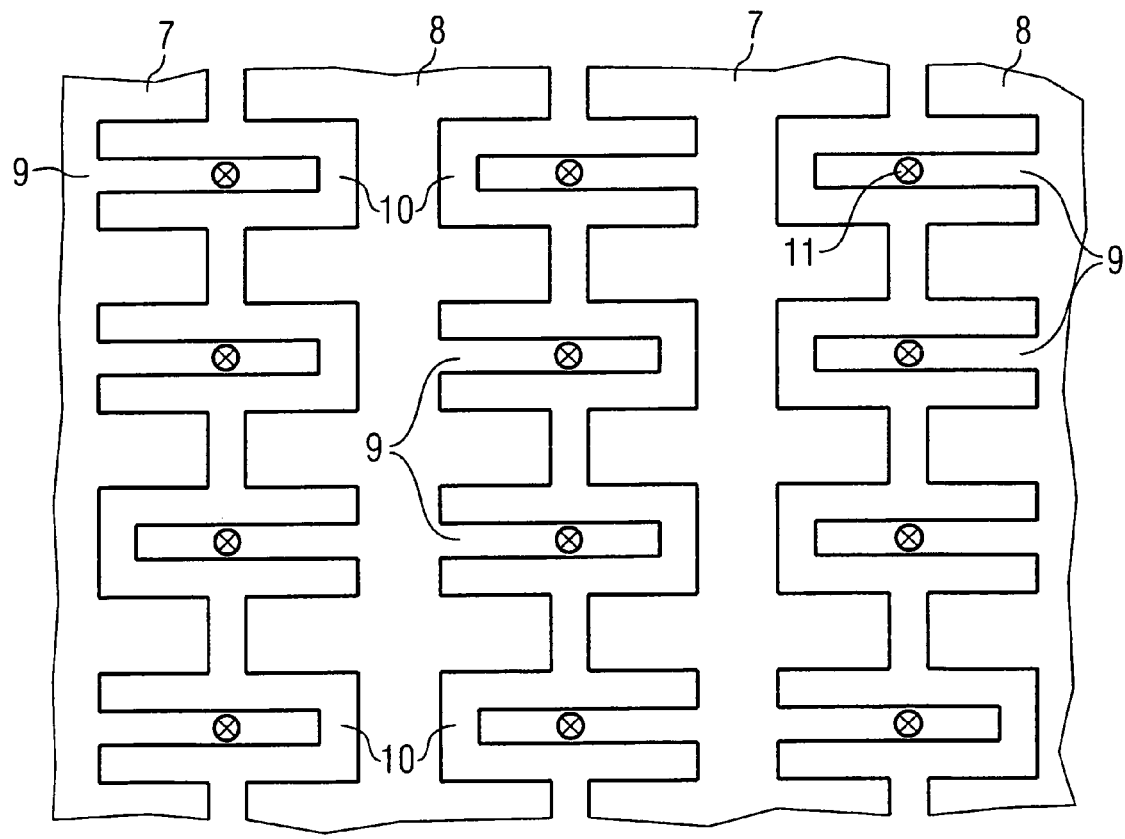
FIG. 4 shows a pattern of the connection plane in the form of a memory cell array.

In the further exemplary embodiment, the connection plane 5 is patterned in accordance with the illustration of FIG. 4. First pads 7 and second pads 8 which are electrically insulated from one another are present. The first pads 7 alternate with the second pads 8, the first pads 7 each being connected to the first potential, for example $V_{SS}$ of the supply voltage, and the second pads 8 being connected to the other potential, $V_{DD}$ in this example. Each memory cell is formed by an electrical connection to either a first pad 7 or a second pad 8. This electrical connection is, for example, a conductor area provided in the connection plane 5, in particular a conductor strip 9, as in the example illustrated in FIG. 4. This conductor area is respectively electrically insulated from the opposite pad; in the case of the exemplary embodiment illustrated in FIG. 4, the conductor strips 9 each have interruptions 10 on the relevant side.

The conductor areas (the conductor strips 9 in this example) have separate electrical connections 11 to an associated read-out circuit, which is arranged in one of the semiconductor chips or proportionately in both semiconductor chips. In the example of FIG. 4, the connections 11 are each situated at the locations which are marked with a cross in the center between two successive pads 7, 8. The exemplary embodiment shown in FIG. 4, in which the first pads 7 and the second pads 8 each have edges patterned in the manner of a comb, has the advantage that it is particularly easy to fabricate. This is because recesses in which a respective conductor strip 9 can be arranged are formed between the pads between the respective projecting portions of the edges. When programming the memory cell array, only one interruption 10 needs to be provided by suitably configuring the mask, which is used during fabrication and respectively isolates the conductor strip 9 from the pad that does not correspond to the relevant programming.

When reading a respective memory cell, a read-out circuit that has been provided uses the connection 11 to establish whether the relevant conductor area of this memory cell is at the higher or lower potential of the supply voltage. These voltage levels are defined as a logic zero and a logic one of the programming.

This exemplary embodiment has the advantage that power is consumed only when the memory cell array is being read. In addition, addressing is particularly simple since the first pads 7 and the second pads 8 are each in the form of strips and can already be used as bit lines. Running transversely to the latter, only the connections 11 on a respective row need to be connected to associated word lines. In this exemplary embodiment, the patterning of the connection plane 5 is thus already particularly well matched to the addressing of the memory cell array.

What is claimed is:

1. A semiconductor chip arrangement, comprising:
   first and second semiconductor chips permanently fastened on top of one another and electrically conductively connected to one another;
   a ROM memory cell array comprising a connecting area, a matrix-like arrangement of cutouts formed in the connecting area, and respective memory contact areas arranged in at least a portion of the cutouts and fastening together the first and second semiconductor chips, wherein a respective memory cell is configured to be programmed by means of the presence or absence of a memory contact area in a respective cutout; and
   at least one read-out circuit located in at least one of the semiconductor chips and configured to apply an electrical potential to and read a respective memory cell,
   wherein the read-out circuit comprises two field effect transistors having sources and drains coupled in series between two potentials of a supply voltage, and having gates coupled to one of the two potentials via a resistor if a memory contact area assigned to the relevant memory cell is not present, and the gates coupled to the other potential via this memory contact area if a memory contact area assigned to the relevant memory cell is present.

2. A semiconductor chip arrangement, comprising:
   face-to-face semiconductor chips;
   a ROM memory cell array coupled between the semiconductor chips and comprising a connecting area, a matrix-like arrangement of cutouts formed in the connecting area, and respective memory contact areas arranged in at least a portion of the cutouts, wherein a memory cell is configured to be programmed by means of the presence or absence of a respective memory contact area; and
   a read-out circuit, which is located in at least one of the semiconductor chips, for reading a respective memory cell, and
   wherein the read-out circuit comprises two field effect transistors having sources and drains coupled in series between two potentials of a supply voltage, and having gates coupled to one of the two potentials via a resistor if a memory contact area assigned to the relevant memory cell is not present, and the gates coupled to the other potential via this memory contact area if a memory contact area assigned to the relevant memory cell is present.

* * * * *